310-322

1/11/83 XR 4,368,401 SR

United States Patent [19]

Martin et al.

[11] 4,368,401

[45] Jan. 11, 1983

[54] TRANSDUCER PLATE FOR PIEZO-ELECTRICAL TRANSDUCERS

[75] Inventors: Erwin Martin; Konrad Walliser, both of Munich, Fed. Rep. of Germany

[73] Assignee: Siemens Aktiengesellschaft, Berlin and Munich, Fed. Rep. of Germany

[21] Appl. No.: 227,465

[22] Filed: Jan. 22, 1981

[30] Foreign Application Priority Data

Feb. 15, 1980 [DE] Fed. Rep. of Germany ....... 3005708

[51] Int. Cl.³ ............................................. H01L 41/08

[52] U.S. Cl. .................................... 310/324; 310/326; 310/327; 310/322; 179/110 A

[58] Field of Search ............... 310/326, 327, 321, 322, 310/324, 312; 179/110 A

[56] References Cited

U.S. PATENT DOCUMENTS

| | | | |
|---|---|---|---|
| 3,708,702 | 1/1973 | Brunnert et al. | 310/8.2 |
| 3,728,562 | 4/1973 | Herson et al. | 310/326 |
| 3,733,590 | 5/1973 | Kaufman | 310/326 X |
| 3,786,202 | 1/1974 | Schafft | 310/326 X |
| 3,863,250 | 1/1975 | McCluskey, Jr. | 310/326 X |
| 4,047,060 | 9/1977 | Schafft | 310/322 |
| 4,310,730 | 1/1982 | Aaroe | 310/326 X |

*Primary Examiner*—Mark O. Budd

[57] ABSTRACT

A transducer plate for piezo-electrical transducers has a piezo-electrical layer or member applied thereon. Unwanted oscillations, in particular the fourth partial oscillation, are attenuated by providing a thickness of the adhesive layer chosen for attenuation properties, and which is thicker than prior art adhesive layers.

7 Claims, 2 Drawing Figures

TRANSDUCER PLATE FOR PIEZO-ELECTRICAL TRANSDUCERS

BACKGROUND OF THE INVENTION

The invention concerns a transducer plate for piezo-electrical transducers in telephone technology with a carrier plate and a piezo-ceramic layer bound to it by means of adhesive applied on one side thereof. The piezo-ceramic layer is provided on both sides with electrodes.

Within the telephone transmission range of approximately 200 to 4,000 Hz, the frequency response of the telephone transducer must lie within a prescribed tolerance scheme. In order to satisfy this condition, it is known to place the fundamental resonance of the deflection vibration within the telephone transmission range, whereby the sensitivity of the transducer is raised to the necessary dimension. For broadening of the transmission range as well as for the boosting of the sensitivity, one further places the resonant frequency of the fourth partial oscillation, which is characterized by a node circle, at the upper boundary of the transmission range. Special resonators then have the task of attenuating the excessive rises in resonance to a given amount. Thus it is known to attenuate the fundamental resonance by means of absorption resonators arranged in the transducer. For the attenuation of the fourth partial oscillation, these absorption resonators however are not suitable since the small perforations required, for example in the transducer floor, are very difficult to produce, or can then easily become soiled, so that an operation with constant frequency response cannot be guaranteed. For this reason, the transducer plate was previously mounted in special bearing bodies (German Pat. No. 1,961,217 corresponding to U.S. Pat. No. 3,708,702, incorporated herein by reference). Further, one dimensioned the piezo-ceramic layer such that the node circle of the fourth partial oscillation develops within the piezo-layer.

As was mentioned above, the piezo-ceramic layer of the transducer plate is bound together with the transducer plate by means of gluing. The adhesive layer is designed as an extremely thin layer so that the adhesive hardens quickly and has no interfering influence on the frequency response of the transducer. It turned out that an adhesive layer of this sort brought with it problems with respect to stability as well as problems with respect to its use in automatic apparatus.

SUMMARY OF THE INVENTION

It is an object of the invention to provide a further possibility for the attenuation, in particular of the fourth partial oscillation, by means of which simultaneously the disadvantages of the previously used adhesive layer are avoided.

This problem is solved according to the invention in that the layer brought about by the adhesive displays a thickness such that it has an attenuating influence on excessive rises in resonance, in particular of the fourth partial oscillation.

In accordance with this concept, the adhesive layer, in contrast to the previous design, is designed thicker. Therefore, adhesives can now find use which essentially are usable with less problems than thin layer adhesives. The spectrum of adhesive which can be used is thus expanded significantly, so that among other things, the adhesive strength between piezo-ceramic and carrier plate could be significantly increased even under extreme environmental conditions. For the attenuation of the fourth partial oscillation, a design of this sort for the adhesive layer provides an extremely practical solution since one to a large extent can dispense with further means for attenuating this oscillation if one adjusts the thickness of the adhesive layer exactly for this.

It has proved to be especially practical when the adhesive layer has a thickness which amounts approximately to 20 . . . 50% (in particular 35%) of the thickness of a piezo-ceramic layer having a diameter of 200 . . . 350 μm; and the adhesive layer 2 having a thickness of approximately 10 . . . 30% (in particular 25%) of the thickness of a carrier plate having a diameter of 40 . . . 45 mm. It can be advantageous when the adhesive layer is applied on one side over the entire surface of the carrier plate.

It can further be practical when the piezo-ceramic layer covers only a portion of the carrier plate. With an embodiment of this sort, piezo-ceramic material can also be conserved.

DESCRIPTION OF THE PREFERRED EMBODIMENTS

Figure 1:
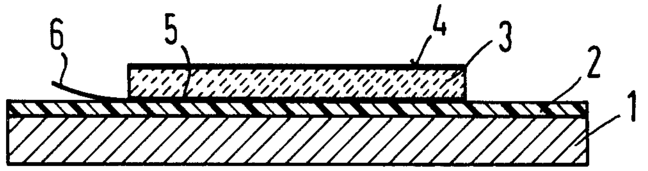
FIG. 1 shows a transducer plate in section.
Figure 2:
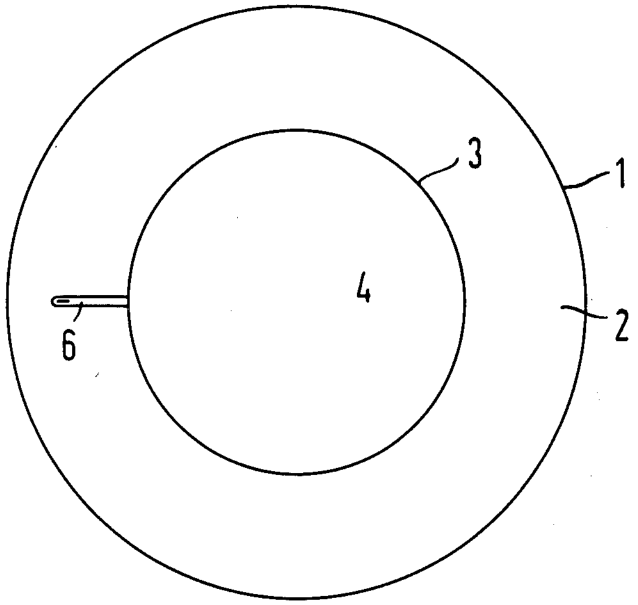
FIG. 2 shows the transducer plate according to FIG. 1 in a top view.

The transducer plate shown in FIGS. 1 and 2 consists of a carrier plate 1 made of aluminum alloy. On one side of the carrier plate, over the entire surface there is applied an adhesive layer 2, which consists of a copolymer or something similar. For example, the adhesive layer may be the polymer compound PEAC polyethylene/acrylate/copolymer, such as produced by the BASF company under the trade-name LUPOLEN A 2910 XM. The piezo-ceramic 3 attaches to this layer, which is coated on both sides in each case with an electrically conductive layer which covers the piezo-ceramic which forms electrodes 4,5. The contacting procedes via small wires or small bands or strips. In FIG. 2 such a small band or strip 6 is depicted which is kept clamped between piezo-ceramic 3 and adhesive layer 2.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A transducer plate for telephone technology piezo-electrical transducers, comprising: a carrier plate and a piezo-ceramic member bound to the plate with an adhesive layer applied on one side thereof; electrodes on both sides of the piezo-ceramic member; the adhesive layer having a thickness selected to have an attenuating influence on excessive rises in resonance; and the adhesive layer having a thickness which amounts approximately to 20 to 50% of a thickness of a piezo-ceramic member having a diameter of 200 to 350 μm, and approximately 10 to 30% of a thickness of a carrier plate having a diameter of 40 to 45 mm.

2. A transducer plate according to claim 1 wherein the adhesive layer thickness is selected to have an attenuating influence on the fourth partial oscillation.

3. A transducer plate according to claim 1 wherein the adhesive layer has a thickness of approximately 35% of the thickness of the piezo-ceramic member having a diameter of 200 to 350 mm.

4. A transducer according to claim 1 wherein the adhesive layer has a thickness of approximately 25% of thickness of the carrier plate having a diameter of 40 to 45 mm.

5. A transducer plate according to claim 1 wherein the adhesive layer is applied on one side over the entire surface of the carrier plate.

6. A transducer plate according to claim 1 wherein the piezo-ceramic member covers only a part of the carrier plate.

7. A telephone technology piezo-electrical transducer system, comprising: a carrier plate having a piezo-ceramic element bound to one surface of the plate by an adhesive layer; electrodes connecting to respective sides of the piezo-ceramic member; and the adhesive layer having a thickness selected to have an attenuating influence on an excessive rise in resonance due to a fourth partial oscillation, said thickness being provided in a range of approximately 20 to 50% of a thickness of the piezo-ceramic member, said piezo-ceramic member having a diameter of 200–350 $\mu$m, and said thickness of the adhesive layer also lying within a range of 10 to 30% of a thickness of the carrier plate, said carrier plate having a diameter of 40 to 45 mm.

* * * * *